United States Patent
Ku

(10) Patent No.: US 7,626,873 B2
(45) Date of Patent: Dec. 1, 2009

(54) SEMICONDUCTOR MEMORY APPARATUS, SEMICONDUCTOR INTEGRATED CIRCUIT HAVING THE SAME, AND METHOD OF OUTPUTTING DATA IN SEMICONDUCTOR MEMORY APPARATUS

(75) Inventor: Kie-Bong Ku, Gyeonggi-do (KR)

(73) Assignee: Hynix Semiconductor Inc., Gyeonggi-Do (KR)

( * ) Notice: Subject to any disclaimer, the term of this patent is extended or adjusted under 35 U.S.C. 154(b) by 48 days.

(21) Appl. No.: 11/878,250

(22) Filed: Jul. 23, 2007

(65) Prior Publication Data

US 2008/0170461 A1 Jul. 17, 2008

(30) Foreign Application Priority Data

Jan. 12, 2007 (KR) ...................... 10-2007-0003646

(51) Int. Cl.
*G11C 7/00* (2006.01)
(52) U.S. Cl. ................ 365/193; 365/189.05; 365/233.1
(58) Field of Classification Search ................ 365/193, 365/189.05, 233.1
See application file for complete search history.

(56) References Cited

U.S. PATENT DOCUMENTS

| 6,064,625 | A | * | 5/2000 | Tomita | 365/233.11 |
|---|---|---|---|---|---|
| 6,519,189 | B2 | * | 2/2003 | Jung | 365/189.05 |
| 6,704,881 | B1 | * | 3/2004 | Li et al. | 713/401 |
| 6,950,370 | B2 | | 9/2005 | Lee | |
| 7,054,221 | B2 | * | 5/2006 | Shim | 365/193 |
| 7,068,549 | B2 | | 6/2006 | Cho | |
| 7,143,258 | B2 | | 11/2006 | Bae | |
| 7,177,379 | B1 | * | 2/2007 | Shihadeh et al. | 375/354 |
| 7,224,625 | B2 | | 5/2007 | Dietrich et al. | |
| 2007/0070676 | A1 | * | 3/2007 | Kim et al. | 365/78 |

FOREIGN PATENT DOCUMENTS

JP 11328963 11/1999
KR 10-1999-0086389 12/1999

* cited by examiner

*Primary Examiner*—Hoai V Ho
(74) *Attorney, Agent, or Firm*—Venable LLP; Jeffri A. Kaminski

(57) ABSTRACT

A semiconductor memory apparatus includes a rising output data generator that generates rising output data from rising data in response to a rising clock and a rising output enable signal. A rising data output buffer buffers the rising output data. A falling output data generator generates falling output data from falling data in response to a falling clock and a falling output enable signal. A falling data output buffer buffers the falling output data.

12 Claims, 4 Drawing Sheets

SEMICONDUCTOR MEMORY APPARATUS, SEMICONDUCTOR INTEGRATED CIRCUIT HAVING THE SAME, AND METHOD OF OUTPUTTING DATA IN SEMICONDUCTOR MEMORY APPARATUS

CROSS-REFERENCE TO RELATED PATENT APPLICATION

This application claims the benefit of Korean Patent Application No. 10-2007-0003646, filed on Jan. 12, 2007, in the Korean Intellectual Property Office, the disclosure of which is incorporated herein in its entirety by reference.

BACKGROUND OF THE INVENTION

1. Technical Field

The present invention relates to a semiconductor memory apparatus, a semiconductor integrated circuit having the same, and a method of outputting data in a semiconductor memory apparatus. In particular, the present invention relates to a semiconductor memory apparatus that increases a time margin between output data and a data output strobe signal, a semiconductor integrated circuit having the same, and a method of outputting data in a semiconductor memory apparatus.

2. Related Art

Generally, in a DDR SDRAM (Double Data Rate Synchronous Dynamic Random Access Memory) and a semiconductor memory apparatus more advanced than the DDR SDRAM, data is output at rising and falling edges of a clock, respectively. To this end, a DLL (Delay Locked Loop) circuit generates a rising clock having a high-level period at a rising edge of an external clock and a falling clock having a high-level period at a falling edge of the external clock. A data output circuit of the semiconductor memory apparatus latches rising output data and falling output data in response to the rising clock and the falling clock, then sequentially buffers the rising output data and the falling output data, and subsequently outputs them as the output data DQ. Further, the data output circuit generates the data output strobe signal DQS from the rising clock and the falling clock and outputs the generated data output strobe signal DQS. Subsequently, a memory control apparatus that controls the semiconductor memory apparatus performs a data recovery operation using the data output strobe signal.

Hereinafter, the operation of a data output circuit in a semiconductor memory apparatus according to the related art will be described with reference to FIG. 1.

FIG. 1 is a timing chart illustrating a data output operation in a semiconductor memory apparatus according to the related art. In FIG. 1, the burst length is, for example, 4.

FIG. 1 shows a rising clock rclk and a falling clock fclk generated by a DLL circuit, output data DQ, and a data output strobe signal DQS. The four output data DQ successively output are alternately synchronized with the rising clock rclk and the falling clock fclk. The data output strobe signal DQS has the same waveform as the rising clock rclk during a period in which the output data DQ is output.

As such, the data output circuit in the semiconductor memory apparatus according to the related art sequentially buffers data latched by the rising clock rclk and the falling clock fclk, outputs the data as the output data DQ, and generates the data output strobe signal DQS from the rising clock rclk and the falling clock fclk. At this time, a time margin between the output data DQ and the data output strobe signal DQS, that is, a valid period tDV of one bit of the output data DQ corresponds to a half cycle of the rising clock rclk or the falling clock fclk. In order to improve a data output speed, a technology that reduces the swing width of data, and provides buffers, which generate output data DQ and inverted output data/DQ, and a data output strobe signal DQS and an inverted data output strobe signal/DQS, is used. In this case, however, the effective period of the output data DQ is not more than the half cycle of the clock.

Meanwhile, with an increase in execution speed of the semiconductor memory apparatus, the toggle speed of the rising clock rclk or the falling clock fclk and the output speed of the output data DQ are significantly increased.

However, since the toggle speed of the data output strobe signal DQS is also increased, the valid period tDV of the output data DQ is significantly decreased. This makes it difficult for the memory control apparatus, which controls the semiconductor memory apparatus, to restore the data. In addition, the valid period tDV of the output data DQ may be further decreased due to resistance and capacitance characteristics of the transmission line from the semiconductor memory apparatus to the memory control apparatus. Further, the valid period tDV of the output data DQ may be decreased due to various factors, such as a change in PVT (Process, Voltage, and Temperature) and the like. As described above, in the related art, it is difficult to secure a time margin between the output data and the data output strobe signal according to the increase in execution speed of the semiconductor memory apparatus.

SUMMARY OF THE INVENTION

Embodiments of the present invention provide a semiconductor memory apparatus that increases a time margin between output data and a data output strobe signal, a semiconductor integrated circuit having the same, and a method of outputting data in a semiconductor memory apparatus.

An embodiment of the present invention provides a semiconductor memory apparatus including: a rising output data generator configured to generate rising output data from rising data in response to a rising clock and a rising output enable signal; a rising data output buffer configured to buffer the rising output data; a falling output data generator configured to generate falling output data from falling data in response to a falling clock and a falling output enable signal; and a falling data output buffer configured to buffer the falling output data.

Another embodiment of the present invention provides a semiconductor memory apparatus including: a data output unit configured to separately buffer rising data and falling data in response to a rising clock and a falling clock, thereby outputting final rising output data and final falling output data; and a data output strobe signal generation unit configured to separately buffer a rising clock and a falling clock, thereby outputting a rising data output strobe signal and a falling data output strobe signal.

Still another embodiment of the present invention provides a semiconductor integrated circuit including: a semiconductor memory apparatus configured to buffer rising data in synchronization with a rising clock in response to a rising output enable signal and to output the buffered rising data through a rising output data pad, and to buffer falling data in synchronization with a falling clock in response to a falling output enable signal and to output the buffered falling data through a falling output data pad; and a memory control apparatus configured to receive the data output from the rising output data pad and the data output from the falling output data pad, and to perform a data recovery operation.

Yet another embodiment of the present invention provides a method of outputting data in a semiconductor memory apparatus including: generating rising output data from rising data in response to a rising clock and a rising output enable signal, and generating falling output data from falling data in response to a falling clock and a falling output enable signal; and buffering the rising output data using a first buffer, thereby outputting final rising output data, and buffering the falling output data using a second buffer, thereby outputting final falling output data.

DESCRIPTION OF EXEMPLARY EMBODIMENTS

Hereinafter, exemplary embodiments of the present invention will be described in detail with reference to the accompanying drawings.

Figure 1:
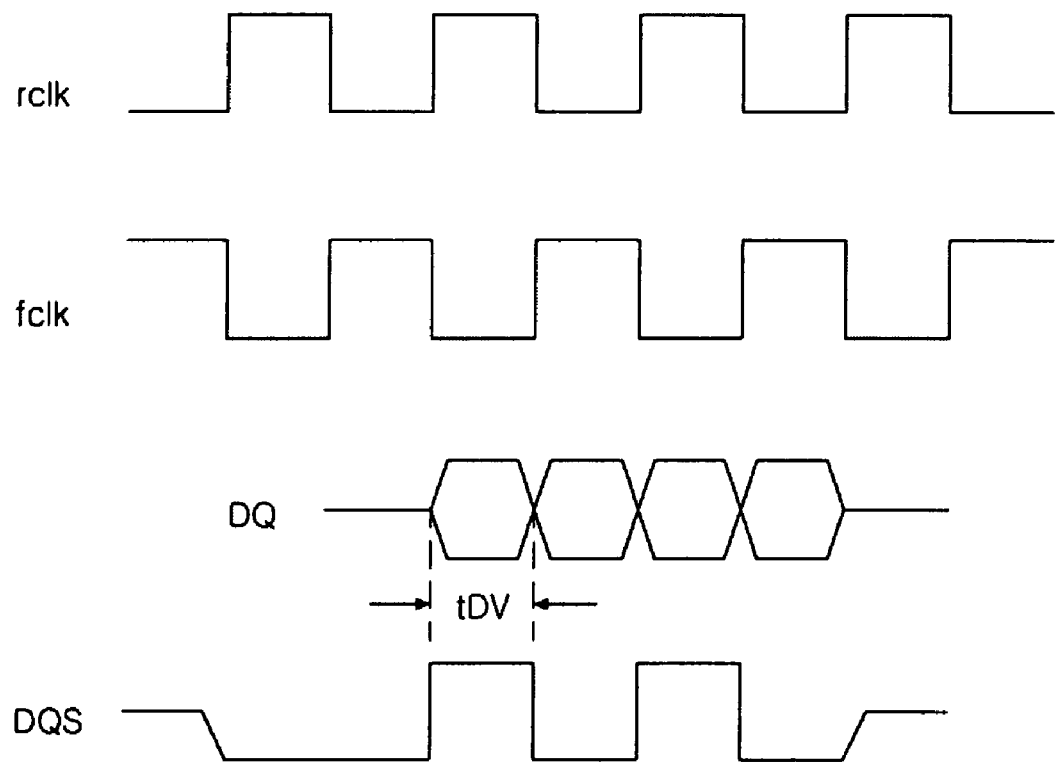
FIG. 1 is a timing chart illustrating a data output operation in a semiconductor memory apparatus according to the related art.
Figure 2:
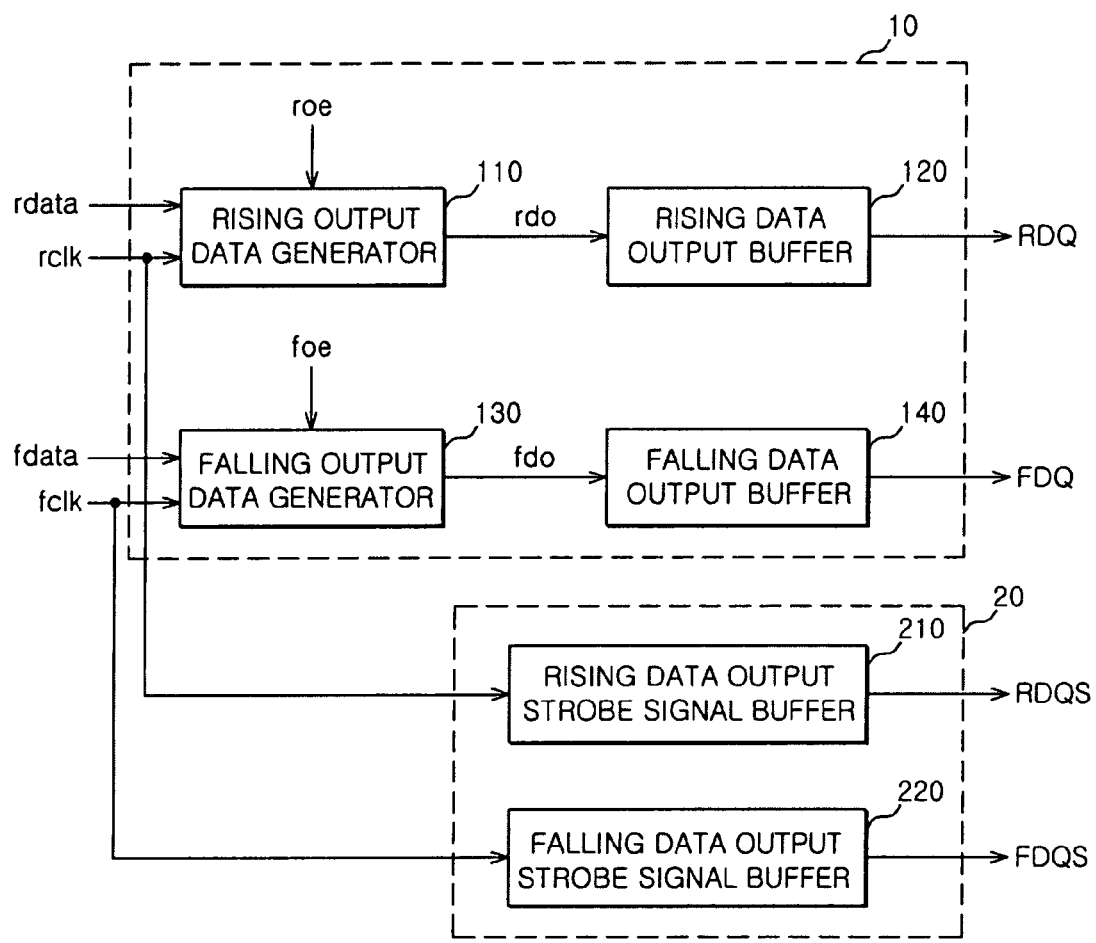
FIG. 2 is a diagram showing the configuration of a data output circuit in a semiconductor memory apparatus according to an embodiment of the present invention.

Referring to FIG. 2, a data output circuit may include a data output unit 10 and a data output strobe signal generation unit 20.

The data output unit 10 may include a rising output data generator 110, a rising data output buffer 120, a falling output data generator 130, and a falling data output buffer 140.

The rising output data generator 110 generates rising output data rdo using rising data rdata in response to a rising clock rclk and a rising output enable signal roe.

The rising data output buffer 120 buffers the rising output data rdo, thereby outputting final rising output data RDQ.

The falling output data generator 130 generates falling output data fdo using falling data fdata in response to a falling clock fclk and a falling output enable signal foe.

The falling data output buffer 140 buffers the falling output data fdo, thereby outputting final falling output data FDQ.

The data output strobe signal generation unit 20 may include a rising data output strobe signal buffer 210 and a falling data output strobe signal buffer 220.

The rising data output strobe signal buffer 210 buffers the rising clock rclk, thereby outputting a rising data output strobe signal RDQS.

The falling data output strobe signal buffer 220 buffers the falling clock fclk, thereby outputting a falling data output strobe signal FDQS.

As described above, the data output circuit according to an embodiment of the present invention may include a buffer that generates the final rising output data RDQ and a buffer that generates the final falling output data FDQ, respectively. Further, the data output circuit may include buffers that generate the rising data output strobe signal RDQS and the falling data output strobe signal FDQS, respectively. Then, the final rising output data RDQ, the final falling output data FDQ, the rising data output strobe signal RDQS, and the falling data output strobe signal FDQS output from the individual buffers are output outside the semiconductor memory apparatus through individual pads. The final rising output data RDQ and the final falling output data FDQ are not inverted with respect to each other. A time required for outputting one-bit data may correspond to one cycle of the clock. That is, when the burst length is 4, the final rising output data RDQ or the final falling output data FDQ is output by two bits, the values of which are maintained during one cycle of the clock.

Figure 3:
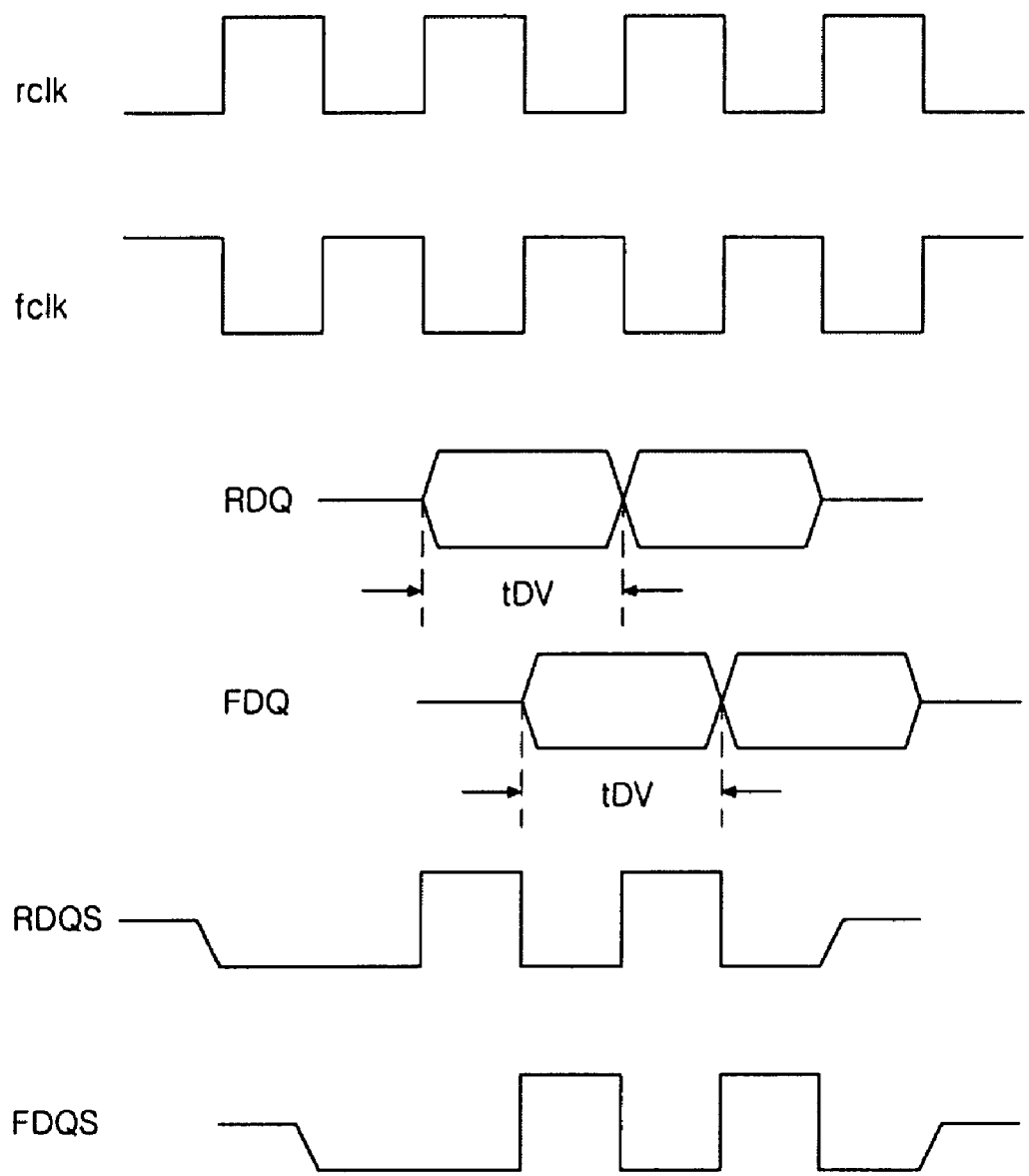
FIG. 3 is a timing chart illustrating the operation of a data output circuit shown in FIG. 2.

FIG. 3 is a timing chart illustrating the operation of the data output circuit shown in FIG. 2. In FIG. 2, the burst length is, for example, 4.

FIG. 3 shows the rising clock rclk, the falling clock fclk, the final rising output data RDQ, the final falling output data FDQ, the rising data output strobe signal RDQS, and the falling data output strobe signal FDQS.

Unlike the related art, in the final rising output data RDQ and/or the final falling output data FDQ, one-bit data maintains its logic value for a time corresponding to one cycle of the rising clock rclk and/or the falling clock fclk. That is, the final rising output data RDO and/or the final falling output data FDO output the one bit data having the corresponding logic value for a time corresponding to the one cycle of the rising clock rclk and/or the falling clock fclk. In that case, the one cycle of the rising clock rclk may be an interval of rising edges of the rising data output strobe signal. Further, the one cycle of the falling clock fclk may be an interval of rising edges of the falling data output strobe signal. Accordingly, a time margin between the final rising output data RDQ and the rising data output strobe signal RDQS, that is, a valid period tDV of the final rising output data RDQ is expanded to a time corresponding to one cycle of the clock. Similarly, a time margin between the final falling output data FDQ and the falling data output strobe signal FDQS, that is, a valid period tDV of the final falling output data FDQ is expanded to a time corresponding to one cycle of the clock.

Figure 4:
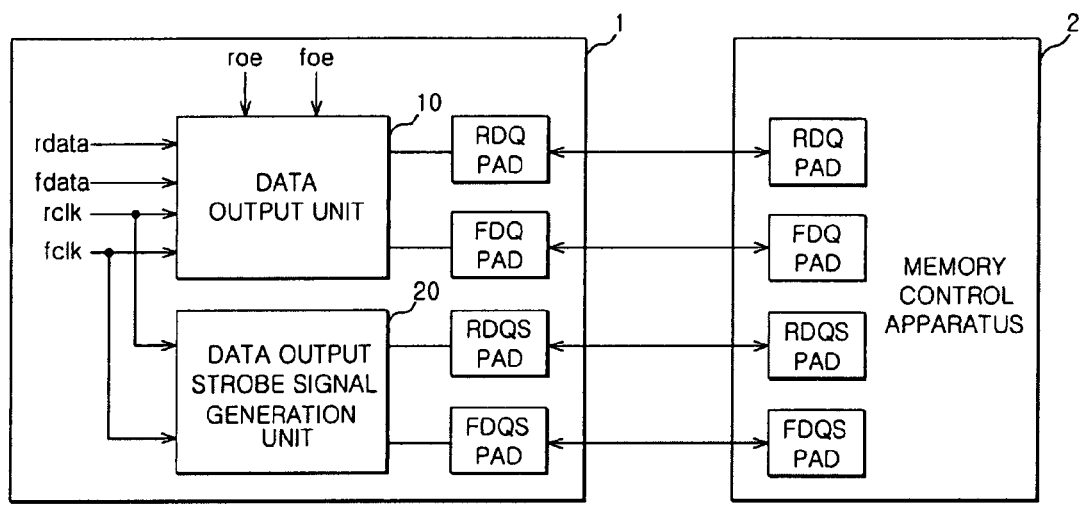
FIG. 4 is a diagram showing the configuration of a semiconductor integrated circuit according to another embodiment of the present invention.

Referring to FIG. 4, the semiconductor integrated circuit according to an embodiment of the present invention includes a semiconductor memory apparatus 1 and a memory control apparatus 2.

The semiconductor memory apparatus 1 includes the data output unit 10 to buffer the rising data rdata in synchronization with the rising clock rclk in response to the rising output enable signal roe and to output the rising data rdata through a rising output data pad RDQ PAD, and to buffer the falling data fdata in synchronization with the falling clock fclk in response to the falling output enable signal foe and to output the falling data fdata through a falling output data pad FDQ PAD.

The semiconductor memory apparatus 1 may include the data output strobe signal generation unit 20 to separately generate the rising data output strobe signal RDQS and the falling data output strobe signal FDQS and to output them through the individual RDQS PAD and FDQS PAD.

The memory control apparatus 2 receives the data output from the rising output data pad RDQ PAD of the semiconductor memory apparatus 1 and the data output from the falling output data pad FDQ PAD of the semiconductor memory apparatus 1, and performs a data recovery operation.

The memory control apparatus 2 may receive signals output through the rising data output strobe signal pad RDQS PAD and the falling data output strobe signal pad FDQS PAD, and use them for the data recovery operation.

The conventional semiconductor memory apparatus sequentially buffers the rising data rdata and the falling data fdata, and generates a single data output strobe signal from the rising clock rclk and the falling clock fclk. In contrast, the semiconductor memory apparatus according to an embodiment of the present invention separately buffers the rising data rdata and the falling data fdata, and may generate the individual data output strobe signals from the rising clock rclk and the falling clock fclk.

The memory control apparatus 2 can smoothly perform an operation to recover data using the final rising output data RDQ and the rising data output strobe signal RDQS, and the final falling output data FDQ and the falling data output strobe signal FDQS.

As described above, the data output circuit for the semiconductor memory apparatus according to an embodiment of the present invention, and the semiconductor integrated circuit having the same include the buffers that generate the final rising output data, the final falling output data, the rising data output strobe signal, and the falling data output strobe signal, respectively. Accordingly, the time margin between the output data and the data output strobe signal is increased. Therefore, the valid period of the output data increases, and the data recovery operation in the memory control apparatus can be easily performed, thereby improving data stability. In particular, even though the characteristics of the individual elements are changed due to a change in PVT, and the valid period of the output data partially decreases, a sufficient valid period is secured, and thus it can be free from the adverse effects.

The semiconductor memory apparatus and the semiconductor integrated circuit having the same may increase the time margin between the output data and the data output strobe signal.

Also, the semiconductor memory apparatus, the semiconductor integrated circuit having the same, and the method of outputting data in a semiconductor memory apparatus may perform a stable data output operation even though the operation characteristics of the individual elements are changed due to the change in PVT.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor memory apparatus comprising:
   a rising output data generator configured to generate rising output data from rising data in response to a rising clock and a rising output enable signal;
   a rising data output buffer configured to buffer the rising output data and to transmit a buffered rising output data to a rising output data pad;
   a falling output data generator configured to generate falling output data from falling data in response to a falling clock and a falling output enable signal; and
   a falling data output buffer configured to buffer the falling output data and to transmit a buffered falling output data to a falling output data pad.

2. The semiconductor memory apparatus of claim 1, further comprising:
   a rising data output strobe signal buffer configured to buffer the rising clock, thereby outputting a rising data output strobe signal; and
   a falling data output strobe signal buffer configured to buffer the falling clock, thereby outputting a falling data output strobe signal.

3. A semiconductor memory apparatus comprising:
   a data output unit configured to separately buffer rising data and falling data in response to a rising clock and a falling clock, thereby outputting final rising output data and final falling output data to a rising output data pad and a falling data output pad, respectively; and
   a data output strobe signal generation unit configured to separately buffer the rising clock and the falling clock, thereby outputting a rising data output strobe signal and a falling data output strobe signal.

4. The semiconductor memory apparatus of claim 3,
   wherein the data output unit comprises:
   a rising output data generator configured to generate rising output data from the rising data in response to the rising clock and a rising output enable signal;
   a rising data output buffer configured to buffer the rising output data and to transmit a buffered rising output data to the rising data output pad;
   a falling output data generator configured to generate falling output data from the falling data in response to the falling clock and a falling output enable signal; and
   a falling data output buffer configured to buffer the falling output data and to transmit a buffered falling data to the falling output data pad.

5. The semiconductor memory apparatus of claim 4,
   wherein the data output unit is configured to generate the rising output data having a valid period corresponding to one cycle of the rising clock and the falling output data having a valid period corresponding to one cycle of the falling clock.

6. The semiconductor memory apparatus of claim 4,
   wherein the data output strobe signal generation unit comprises:
   a rising data output strobe signal buffer configured to buffer the rising clock, thereby outputting the rising data output strobe signal; and
   a falling data output strobe signal buffer configured to buffer the falling clock, thereby outputting the falling data output strobe signal.

7. A semiconductor integrated circuit comprising:
   a semiconductor memory apparatus configured to buffer rising data in synchronization with a rising clock in response to a rising output enable signal to obtain buffered rising data and to output the buffered rising data through a rising output data pad, and to buffer falling data in synchronization with a falling clock in response to a falling output enable signal to obtain buffered falling data and to output the buffered falling data through a falling output data pad; and
   a memory control apparatus configured to receive the buffered rising data output from the rising output data pad and the buffered falling data output from the falling output data pad, and to perform a data recovery operation.

8. The semiconductor integrated circuit of claim 7,
   wherein the semiconductor memory apparatus comprises:
   a rising output data generator configured to generate rising output data from the rising data in response to the rising clock and the rising output enable signal;
   a rising data output buffer configured to buffer the rising output data and to transmit the buffered rising output data as the buffered rising data to the rising output data pad;
   a falling output data generator configured to generate falling output data from the falling data in response to the falling clock and the falling output enable signal; and a falling data output buffer configured to buffer the falling output data and to transmit the buffered falling output data as the buffered falling data to the falling output data pad.

9. The semiconductor integrated circuit of claim 8, wherein the semiconductor memory apparatus further comprises:

a rising data output strobe signal buffer configured to buffer the rising clock to obtain a buffered rising clock and to transmit the buffered rising clock to a rising data output strobe signal pad; and a falling data output strobe signal buffer configured to buffer the falling clock to obtain a buffered falling clock and to transmit the buffered falling clock to a falling data output strobe signal pad.

10. A method of outputting data in a semiconductor memory apparatus, the method comprising:

generating rising output data from rising data in response to a rising clock and a rising output enable signal, and generating falling output data from falling data in response to a falling clock and a falling output enable signal; and buffering the rising output data using a first buffer and buffering the falling output data using a second buffer, thereby outputting final rising output data and final falling output data to a rising output data pad and a falling output data pad, respectively.

11. The method of claim 10, wherein the outputting of the final rising output data and the final falling output data further comprises:

buffering the rising clock using a third buffer and buffering the falling clock using a fourth buffer, thereby outputting a rising data output strobe signal and a falling data output strobe signal, respectively.

12. The method of claim 11, wherein, in the outputting of the final rising output data and the final falling output data, one-bit data of the final rising output data maintains its corresponding logic value for a time corresponding to an interval of rising edges of the rising data output strobe signal, and one-bit data of the final falling output data maintains its corresponding logic value for a time corresponding to an interval of rising edges of the falling data output strobe signal.

* * * * *